310-337 SR
10/3/78 OR 4,118,649

United States Patent [19]

Shwartzman et al.

[11] 4,118,649

[45] Oct. 3, 1978

[54] TRANSDUCER ASSEMBLY FOR MEGASONIC CLEANING

[75] Inventors: Stanley Shwartzman, Somerville; Alfred Mayer, Plainfield, both of N.J.

[73] Assignee: RCA Corporation, New York, N.Y.

[21] Appl. No.: 800,276

[22] Filed: May 25, 1977

[51] Int. Cl.[2] .......... H01L 41/10

[52] U.S. Cl. .......... 310/337; 29/25.35; 310/334; 366/114

[58] Field of Search .......... 310/322, 324, 326, 327, 310/334, 336, 337; 259/1 R, 72, DIG. 44; 340/9, 10; 134/184

[56] References Cited

U.S. PATENT DOCUMENTS

| | | | |
|---|---|---|---|
| 2,865,016 | 12/1958 | Hudimac et al. | 340/9 |
| 2,911,484 | 11/1959 | Spitzer et al. | 340/10 X |
| 3,239,696 | 3/1966 | Burkhalter et al. | 310/327 |
| 3,376,438 | 4/1968 | Colbert | 310/327 |
| 3,396,286 | 8/1968 | Anderson et al. | 310/334 |
| 3,510,698 | 5/1970 | Massa | 340/10 X |

*Primary Examiner*—Mark O. Budd
*Attorney, Agent, or Firm*—H. Christoffersen; T. H. Magee

[57] ABSTRACT

A transducer assembly adapted to oscillate at an ultrasonic frequency comprises a metallic foil having a back surface, at least one transducer having one face thereof mounted adjacent to the back surface by conductive means disposed therebetween, and insulating means disposed in the area adjacent to the back surface and surrounding the edges of the transducer for supporting the foil and transducer in relatively fixed relationship.

10 Claims, 3 Drawing Figures

TRANSDUCER ASSEMBLY FOR MEGASONIC CLEANING

This invention relates to a transducer assembly adapted to oscillate at an ultrasonic frequency for propagating a beam of ultrasonic energy into a fluid adjacent thereto.

Cleaning systems for use in manufacturing semiconductor devices effectively utilize ultrasonic energy which is propagated into standard chemical solutions by transducer crystals. The crystals may oscillate at an ultrasonic frequency in the range of between about 0.2 and 5 MHz, and thus such cleaning systems are labeled as "megasonic" cleaning systems. These systems effectively remove particles down to at least 0.3 micrometers in diameter from both sides of semiconductor wafers simultaneously, together with organic surface film, ionic impurities and many other contaminants. In ultrasonic cleaning systems where the transducer crystals oscillate at relatively low frequency, such as less than 100 KHz, the transducers may be clamped to a metallic sheet which is strong enough to be self-supporting, for example, the wall of a cleaning tank. However, such arrangements are not practical at higher frequencies in the megasonic range, due to the energy loss by attenuation caused by the relatively thick wall of the tank. Megasonic cleaning is applied to silicon wafers at all processing stages, to ceramics, photomasks, and for photoresist removal, dewaxing and degreasing by using different solvents and stripping solutions. The outstanding advantages are major savings in chemicals, superior cleanliness, ability to clean both sides of a plurality of wafers simultaneously, and less handling.

A megasonic cleaning system should be capable of cleaning batches of up to 100 or more silicon wafers or photomasks which can be as large as 6 inches square. One embodiment of a megasonic cleaning system is disclosed in detail in U.S. Pat. No. 3,893,869, issued to the same inventors on July 8, 1975 and assigned to RCA Corporation. The cleaning station described therein comprises a pair of glass-coated cobalt barium titanate transducer crystals which are energized by separate power supplies and oscillate at a frequency of between about 0.2 and 5 MHz in order to propagate beams of ultrasonic energy into an adjacent cleaning fluid. Since the small size of the commercially available ceramic transducer crystals limits the active area available for energy propagation, the wafers are moved, by a rotary apparatus and cams, through a near-rectangular path across the beams of the two transducers so that all the wafers are subjected to the beams of ultrasonic energy. Such a cam operated mechanical motion imparted to the wafers during the cleaning process insures that all of the wafers will be cleaned. However, the design of such a mechanically moved cleaning system for large numbers of large wafers has proved to be difficult, clumsy and expensive. In addition, the glass protective coating, which covers the front of the transducer crystal, slowly erodes so that after about 30 to 40 hours of operation the enclosing case has to be disassembled and the crystal replaced. The present invention overcomes these disadvantages by providing a novel structure for a transducer assembly designed to operate over a large-size area at maximum output efficiency and with a greatly prolonged operating life.

Figure 1:
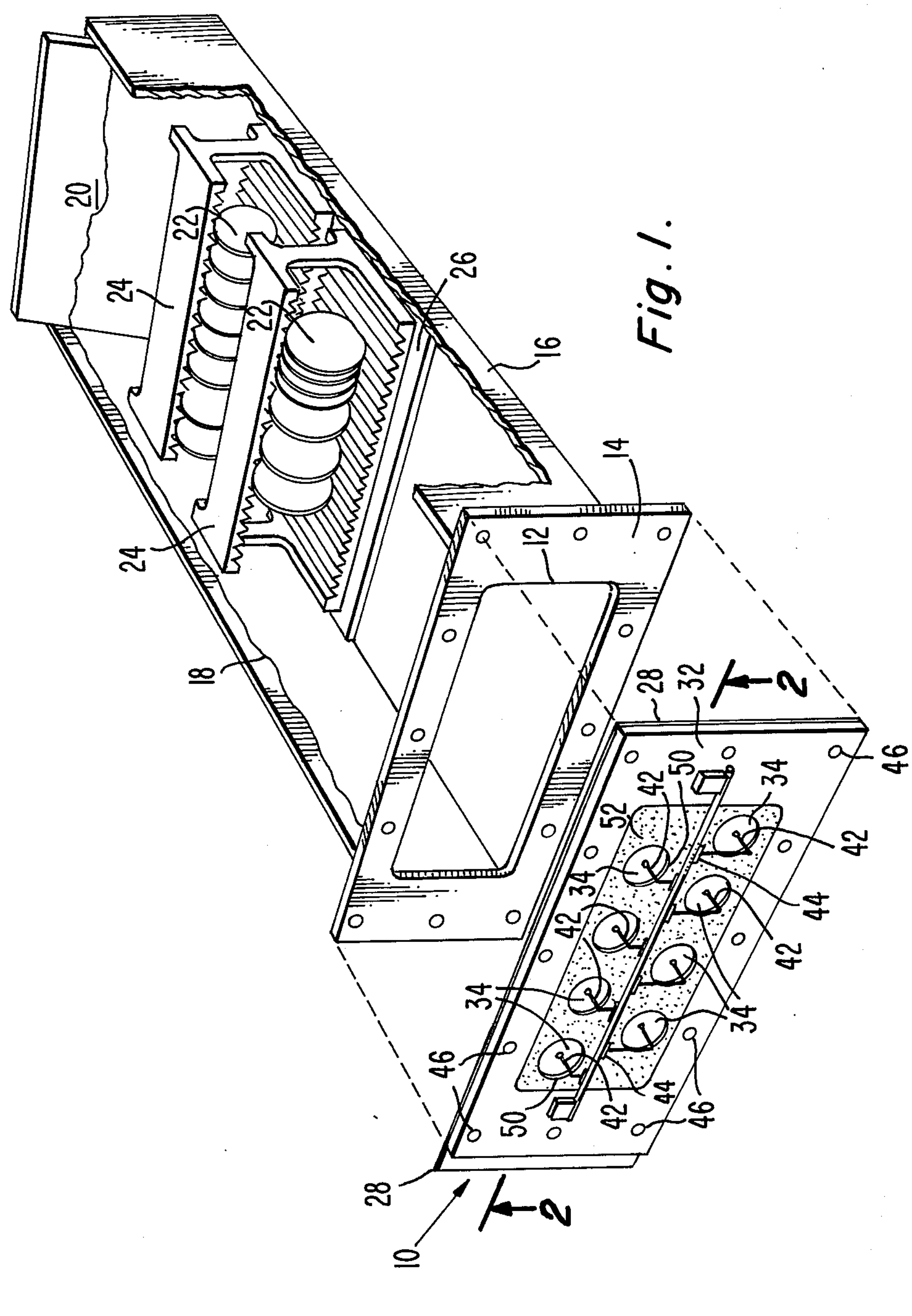
FIG. 1 is a partial, perspective view illustrating a megasonic cleaning tank with an exploded view of the present novel transducer assembly at one end thereof.

Referring to FIG. 1 of the drawings, there is shown one embodiment of the novel transducer assembly 10 disassembled from and adjacent to an opening 12 at one end 14 of a cleaning tank 16 adapted to hold a chemical cleaning fluid 18. The transducer assembly 10 may be used in cooperation with the tank 16. The tank 16 is made of material which is resistant to the cleaning fluid 18; in the present embodiment the tank 16 consists of polypropylene. At the other end of the tank 16 is a reflecting plate 20 for reflecting pressure waves, propagated by the transducer assembly 10, back towards the surface of the fluid 18, so that the reflected beams clear the tank 16 and do not interfere with the ongoing cleaning action of subsequent pressure waves. High frequency ultrasonic energy is rapidly absorbed by air, so there is no danger to an operator created by the beams emerging from the tank 16. A plurality of silicon wafers 22 whose surfaces are to be cleaned are disposed parallel to each other in typical wafer holders 24 which rest on a platform 26 within the tank 16. Such a tank 16 may comprise a portion of a megasonic cleaning system as described in greater detail in the aforementioned U.S. Pat. No. 3,893,869.

Figure 2:
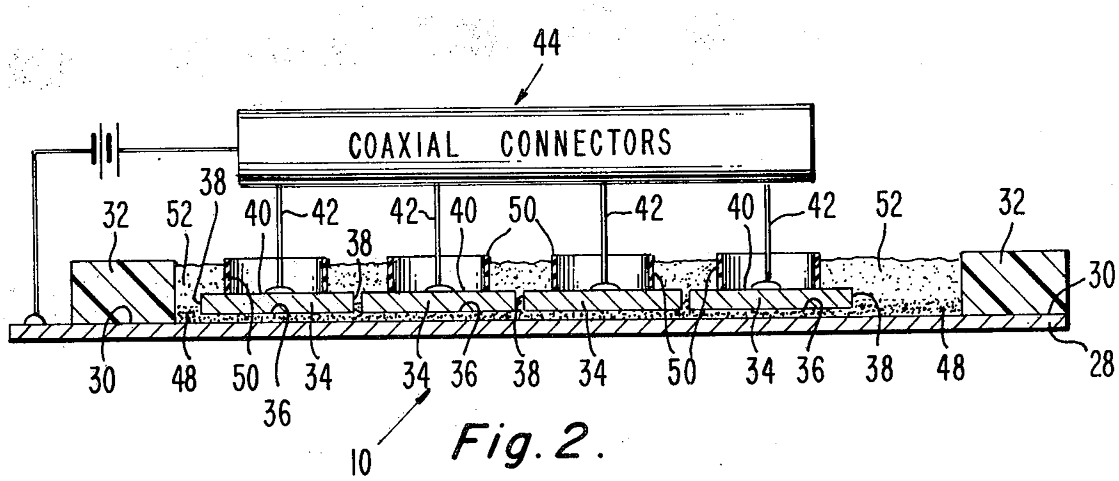
FIG. 2 is a cross-sectional view taken along line 2—2 of FIG. 1.

Referring to both FIGS. 1 and 2, the novel transducer assembly 10 comprises a metallic foil 28 having a back surface 30. Preferably, the back surface 30 of the foil 28 is disposed across a frame 32. In the embodiment shown, a plurality of transducers 34 are mounted within the frame 32 and have one set of faces 36 thereof mounted adjacent to the back surface 30 by conductive means 48 disposed therebetween. Insulating means 52 are disposed in the area within the frame 32 adjacent to the back surface 30 and surrounding the edges 38 of the transducers 34 for supporting the frame 32, foil 28 and transducers 34 in relatively fixed relationship while allowing electrical connection to the opposite faces 40 of the transducers 34. Preferably, electrical connection is made to the transducers 34 by contacting the metallic foil 28 which serves as the common front electrode, and by soldering individual wires 42 to each of the opposite faces 40 of the transducers 34. These wires 42 extend to coaxial connectors 44 which are mounted to the frame 32. The frame is then bolted to the end 14 of the tank 16 through holes 46 therein, utilizing a silicone rubber gasket (not shown) in order to seal the metal foil 28 over the opening 12 in the tank 16.

Figure 3:
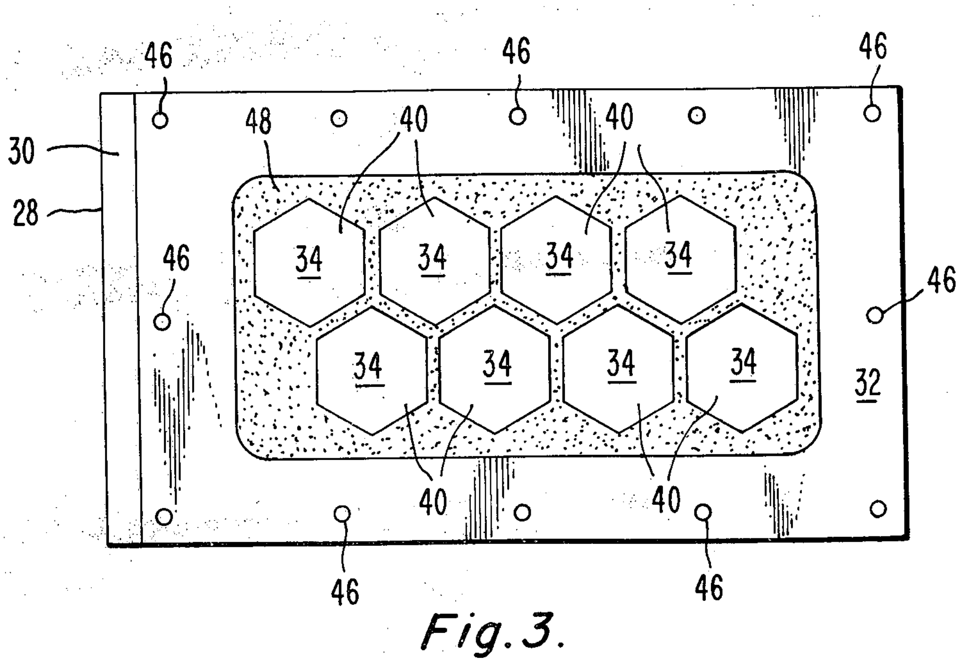
FIG. 3 is a plan view of the present novel transducer assembly during fabrication thereof.

Referring to FIGS. 2 and 3, the novel construction of the transducer assembly 10 starts by placing the metallic foil 28 on a flat aluminum plate (not shown) so that the back surface 30 of the foil is exposed. The foil may comprise any workable material which does not erode when exposed to the chemical cleaning fluid. Preferably, the foil 28 is either zirconium or tantalum and has a thickness between about 5 and 50 micrometers. The foil 28 should be examined carefully to be sure that it has no pinholes therein. The foil 28 should be free of all particles, and the back surface 30 should also be wiped clean with an acetone solution using a soft lint-free cloth.

An even coat of the conductive means 48 is next spread over the back surface 30 of foil 28 using preferably a soft camel-hair brush. The coating should be as thin as possible so that it does not ooze up between the transducers 34 when they are subsequently set in place. Also, care should be taken to insure that no air spaces are present in the coating, as air spaces will reduce the output efficiency of the transducers 34. In the present embodiment, the coating is placed in a vacuum oven at room temperature for approximately fifteen minutes in order to remove the solvent from the coating. Such conductive means 48 is preferably a silver-loaded epoxy, commercially available as Shell Chemical 815 and Shell Chemical V-40 from Shell Oil Company, Houston, Texas.

A plurality of transducers 34 are next mounted in relatively close proximity to each other to form an array within the frame 32 and adjacent to the back surface 30 of the foil 28. Preferably, the edges 38 of the transducers 34 are first coated with a mold release in order to prevent the insulating means 52 from sticking thereto. The one set of faces 36 may also be coated with the silver-loaded epoxy. The transducers 34, with their sides of same polarity up, such as all "+ sides" up, are then cemented onto the back surface 30 of the foil 28 by pressing down with a firm twisting motion to assure good contact over the entire surface. The silver-loaded epoxy must not ooze up between the transducers 34 when they are set in place, thereby preventing the two faces 36 and 40 from being shorted out.

Referring to FIG. 3, the present embodiment of the novel transducer assembly 10 comprises eight transducers 34 mounted in two adjacent rows of four each, since a large active cleaning area is desired and transducer crystals are not available in sizes greater than about 2½ inches (63.5 millimeters) in diameter. The transducers 34, as received, are typically 2 millimeters in thickness and circular in shape, with a diameter of about 50 millimeters. The transducers 34 used in the preferred embodiment are piezoelectric ceramic crystals which are commercially available from Gulton Industries, Fullerton, California. Lead zirconate titanate crystals are used in the present embodiment; however, cobalt barium titanate crystals may also be used. Preferably, the eight transducers 34 are cut into hexagons, as shown in FIG. 3, in order to increase the packing density and still not lose too much energy at the corners. The hexagonal-shaped transducers 34 are mounted close together with a spacing of about 0.4 millimeters to prevent contact with each other in order to permit independent vibrations and reduce power loss by damping. The transducers 34 may also be shaped into squares or rectangles. After mounting the transducers 34, the silver-loaded epoxy is allowed to cure for about 20 hours at room temperature.

In the preferred embodiment, the novel transducer assembly 10 further comprises restricting means for keeping the central area of the opposite faces 40 free of the insulating means 52. The restricting means may comprise styrene cylinders 50 which are cut from styrene containers and cemented in surrounding relationship to the central area of the opposite faces 40. The purpose of these cylinders 50 is to restrict the insulating means 52 to the edges 38 of the transducers 34, so that it does not interfere with the oscillating motion of the transducers 34.

The frame 32 is next placed over the transducers 34 adjacent to the foil 28, and bolted to the aluminum plate (not shown). Insulating means 52 is then used to fill in the area within the frame 32 adjacent to the back surface 30 and surrounding the edges 38 of the transducers 34. In the present embodiment, a potting epoxy is used for the insulating means 52 and is poured into this area up to about the top of the frame 32, as shown in FIG. 2. Such a potting epoxy is available as epoxy 2850 from Emerson and Cumming, Inc., Canton, Mass. After filling in this area, the epoxy is cured in a vacuum oven at 70° C. for about 16 hours.

The coaxial connectors 44 are now mounted to the frame 32. The connecting wires 42 are run therefrom and soldered, using a silver bearing solder, to the opposite faces 40 of the transducers 34 in a conventional manner. The frame 32 is next removed from the aluminum plate and bolted to the end 14 of the tank 16, while making sure that pointed articles are kept away from the foil 28 to prevent pin-hole generation. As previously mentioned, a silicone rubber gasket (not shown) is used to seal the metal foil 28 over the opening 12 in the tank 16.

In operation, the individual transducers 34 of the transducer assembly 10 can be electronically switched on and off to suit any operating sequence found to provide the best cleaning action, thus eliminating the need for any mechanical motion. Typically, one power supply switches from one transducer 34 to the next in each row electronically; each transducer 34 is on for about 1 second. The next transducer 34 is turned on before the first one is turned off by means of the coaxial connectors 44 so as to avoid a large rf voltage spike that could cause destructive arcing. A switch (not shown) may allow one to select pairs of transducers 34 in any sequence and for any period of time. The transducer assembly 10 can be driven by a pulsed signal, continuous wave (*cw*), or *cw* with some frequency modulation to help eliminate standing waves created within the cleaning tank 16.

The novel construction of the transducer assembly 10 allows the ceramic crystals to be protected from the effects of operating in a corrosive liquid. The metallic foil 28 serves as a common front electrode and also as a protective layer against corrosion. The foil 28 is impervious to standard cleaning solutions and is not detrimental to the operation of the transducers 34. The assembly 10 has survived several hundred hours of testing with no corrosive effects as determined by analysis or loss in output power. The present invention permits the transducer array to operate at maximum output efficiency (without appreciable damping) while covering maximum area, and with greatly prolonged operating life.

What is claimed is:

1. A transducer assembly adapted to oscillate at a megasonic frequency for propagating a beam of ultrasonic energy into a fluid adjacent thereto comprising:

a metallic foil having a back surface, said foil having a thickness between about 5 and about 50 micrometers, at least one transducer having one face thereof mounted adjacent to said back surface by a conductor-loaded epoxy disposed therebetween, and insulating means disposed in the area adjacent to said back surface and surrounding the edges of said transducer for supporting said foil and transducer in relatively fixed relationship while allowing electrical connection to the opposite face of said transducer.

2. A transducer assembly as defined in claim 1 further comprising a frame surrounding said transducer and adjacent said back surface, and restricting means for keeping the central area of said opposite face free of said insulating means.

3. A transducer assembly as defined in claim 2 wherein said restricting means comprises a styrene cylinder disposed in surrounding relationship to the central area of said opposite face.

4. A transducer assembly as defined in claim 2 comprising a plurality of transducers mounted as polygons in relatively close proximity to each other with a spacing of less than about 0.5 millimeter to form an array.

5. A transducer assembly as defined in claim 4 comprising eight hexagonal-shaped transducers mounted in two adjacent rows, each of said rows having four transducers therein.

6. A transducer assembly as defined in claim 5 wherein said transducers are lead zirconate titanate crystals having the edges thereof coated with a mold release.

7. A transducer assembly as defined in claim 2 wherein said metallic foil is zirconium, and wherein said frame is insulating material.

8. A transducer assembly as defined in claim 2 wherein said metallic foil is tantalum, and wherein said frame is polypropylene.

9. A transducer assembly as defined in claim 1 wherein said conductor-loaded epoxy is a silver-loaded epoxy.

10. A transducer assembly as defined in claim 1 wherein said insulating means is a potting epoxy.

* * * * *